(12) United States Patent
Mizuguchi

(10) Patent No.: US 7,843,690 B2
(45) Date of Patent: Nov. 30, 2010

(54) FIXING STRUCTURE OF WIRING AND IMAGE FORMING APPARATUS

(75) Inventor: Keisuke Mizuguchi, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 216 days.

(21) Appl. No.: 11/429,894

(22) Filed: May 8, 2006

(65) Prior Publication Data

US 2007/0165378 A1 Jul. 19, 2007

(30) Foreign Application Priority Data

Jan. 19, 2006 (JP) ............................. 2006-010823

(51) Int. Cl.
*H05K 7/20* (2006.01)
(52) U.S. Cl. .................. 361/695; 439/487; 174/17 VA; 415/176
(58) Field of Classification Search ................. 361/695, 361/697–698, 700, 724, 679.48, 679.57, 361/679.58, 690, 692, 694; 165/80.3–80.4, 165/121, 185, 104.21, 104.33; 174/135, 174/15.1, 72 A, 17 VA; 439/660, 502, 577, 439/247–248, 485
See application file for complete search history.

(56) References Cited

U.S. PATENT DOCUMENTS

| 5,142,442 | A | * | 8/1992 | Daniels et al. | ............... 361/687 |
|---|---|---|---|---|---|
| 5,816,081 | A | * | 10/1998 | Johnston | ........................ 70/58 |
| 6,388,196 | B1 | * | 5/2002 | Liu et al. | .................... 174/135 |
| 6,419,007 | B1 | * | 7/2002 | Ogawara et al. | ........... 165/80.3 |
| 6,438,309 | B1 | * | 8/2002 | Franz | ......................... 385/135 |
| 6,639,797 | B2 | * | 10/2003 | Saeki et al. | .................. 361/698 |
| 6,808,411 | B2 | * | 10/2004 | Chen | .......................... 439/485 |
| 6,989,988 | B2 | * | 1/2006 | Arbogast et al. | ............ 361/695 |
| 7,177,149 | B2 | * | 2/2007 | Lin | ............................ 361/695 |
| 7,221,567 | B2 | * | 5/2007 | Otsuki et al. | ................ 361/695 |
| 7,273,400 | B2 | * | 9/2007 | Horng et al. | ................ 439/660 |
| 7,277,281 | B1 | * | 10/2007 | Lu et al. | ..................... 361/695 |
| 7,289,324 | B2 | * | 10/2007 | Yu | ............................. 361/697 |
| 7,336,489 | B1 | * | 2/2008 | Chen et al. | .................. 361/700 |
| 7,349,210 | B2 | * | 3/2008 | Sheng et al. | ................ 361/695 |
| 2007/0035926 | A1 | * | 2/2007 | Xia et al. | .................... 361/695 |

FOREIGN PATENT DOCUMENTS

JP 2003-162189 6/2003

* cited by examiner

*Primary Examiner*—Jayprakash N Gandhi
*Assistant Examiner*—Courtney Smith
(74) *Attorney, Agent, or Firm*—Jordan and Hamburg LLP

(57) ABSTRACT

The object of this invention is, in an electronic device provided with a supporting member that supports a drive member driven with vibration by engaging therewith, to provide the fixing structure of wiring that realizes the following: alleviation of the wobble generated by the vibration at the operating time of the drive member, reduction of unwanted sound and vibration caused by the above wobble, and inexpensive fixing of a wire without additional and specific members for wiring.

This invention is constituted as a fixing structure of wiring for fixing a wire wired in an electronic device, wherein a drive member driven with vibration and a supporting member for supporting the drive member by engaging therewith are provided in the electronic device, and wherein the wire is fixed by being interposed in a gap formed between the drive member and the supporting member.

14 Claims, 5 Drawing Sheets

(a)

(b)

FIXING STRUCTURE OF WIRING AND IMAGE FORMING APPARATUS

BACKGROUND OF THE INVENTION

1. Field of the Invention

The present invention relates to a fixing structure of wiring for fixing a wire wired in an electronic device and an image forming apparatus comprised thereof, and particularly, relates to a fixing structure of wiring, which can fix a wire without additional and specific components, and an image forming apparatus comprised thereof.

2. Description of the Related Art

Conventionally, as a structure for fixing a wire wired in an electronic device in a proper position, it has been general to provide specific and additional materials for fixing a wire.

The image forming apparatus disclosed in Japanese Unexamined Patent Publication No. 2003-162189 is provided with a specific duct of semicircular and tubular shape in a duct mounted with an exhaust fan. This specific duct has a structure, which by setting a wire thereon, does not allow the wire set on the specific duct to slide off.

However, the image forming apparatus disclosed in the prior art 1 had a problem of additional cost, since additional and specific materials were required.

On the other hand, in an electronic device such as an image forming apparatus, a drive member that is driven with vibration of such as a fan is generally provided. As a fixing structure of such drive member, the drive member may be engaged to a supporting member that supports the drive member, and not fixed by screws. However, when fixing only by engagement as noted above, the wobble may be generated by the vibration at the operating time of the drive member because of the size tolerance at the engaging part between the drive member and the supporting member, and additionally, unwanted sound as well as vibration occurred by such wobble has been a problem.

Consequently, this invention has been invented considering the foregoing conditions, and the purpose of this invention is, with respect to an electronic device provided with a supporting member that supports a drive member driven with vibration by engaging therewith, to provide the fixing structure of wiring that realizes the following: alleviation of the wobble generated by the vibration at the operating time of the drive member, reduction of unwanted sound and vibration caused by the above wobble, and inexpensive fixing of a wire without additional and specific components for wiring.

SUMMARY OF THE INVENTION

In order to achieve the foregoing purpose, this invention is comprised as an fixing structure of wiring for fixing a wire wired in an electronic device, wherein a drive member driven with vibration as well as a supporting member that supports the drive member by engaging therewith are provided in the electronic device, and wherein the wire is fixed by being interposed in a gap formed between the drive member and the supporting member.

As an example of general wires, the present invention comprises a core material such as tin and soft copper, as well as a coating member as the member provided with elasticity of such as vinyl chloride and polyethylene that coats above core material.

Therefore, in the fixing structure of wiring as structured above, the drive member and the wire come into contact each other by interposing the wire in a gap formed between the drive member and the supporting member, and therefore, the drive member is elastically supported by elastic function of the coating member of the wire. This elastic function suppresses the vibration transmission of the drive member. Additionally, the wobble between the drive member and the supporting member mounted in the electronic device is also dissolved with an infill of the wire as the elastic body.

Also, both of the above drive member and the supporting member are provided with an even surface facing each other when in mounted condition, and the wire is preferably fixed by being interposed in between the even surfaces.

Interposing the wire in between the even surfaces indicates the pressure provided to the wire being dispersed, and the possibility of deformation or damage of the wire becomes low, compared to the case when the wire is interposed between lines, points or edges.

On the other hand, the drive member may be a fan rotatably driven by a prescribed motor.

The above fixing structure of wiring can be applied to electronic devices, such as personal computers provided with fans and image forming apparatuses.

When a drive member driven with vibration is provided in an electronic device, the drive member may be supported by a supporting member that supports the drive member by engaging therewith. In such case, the present invention can realize alleviation of the wobble generated by the vibration at the operating time of the drive member, as well as reduction of unwanted sound and vibration caused by the above wobble, and provide a fixing structure of wiring capable of fixing the wire inexpensively without additional and specific materials for wiring.

BRIEF DESCRITPTION OF THE DRAWINGS

Figure 4:
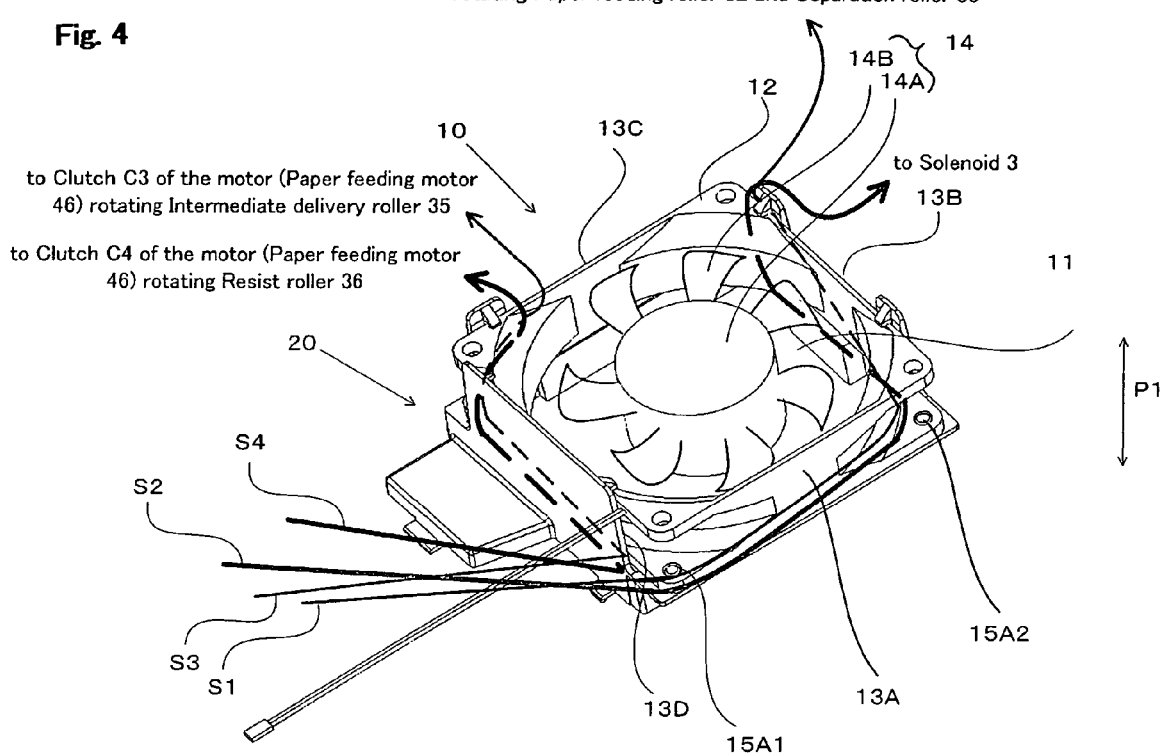
Figure 5:
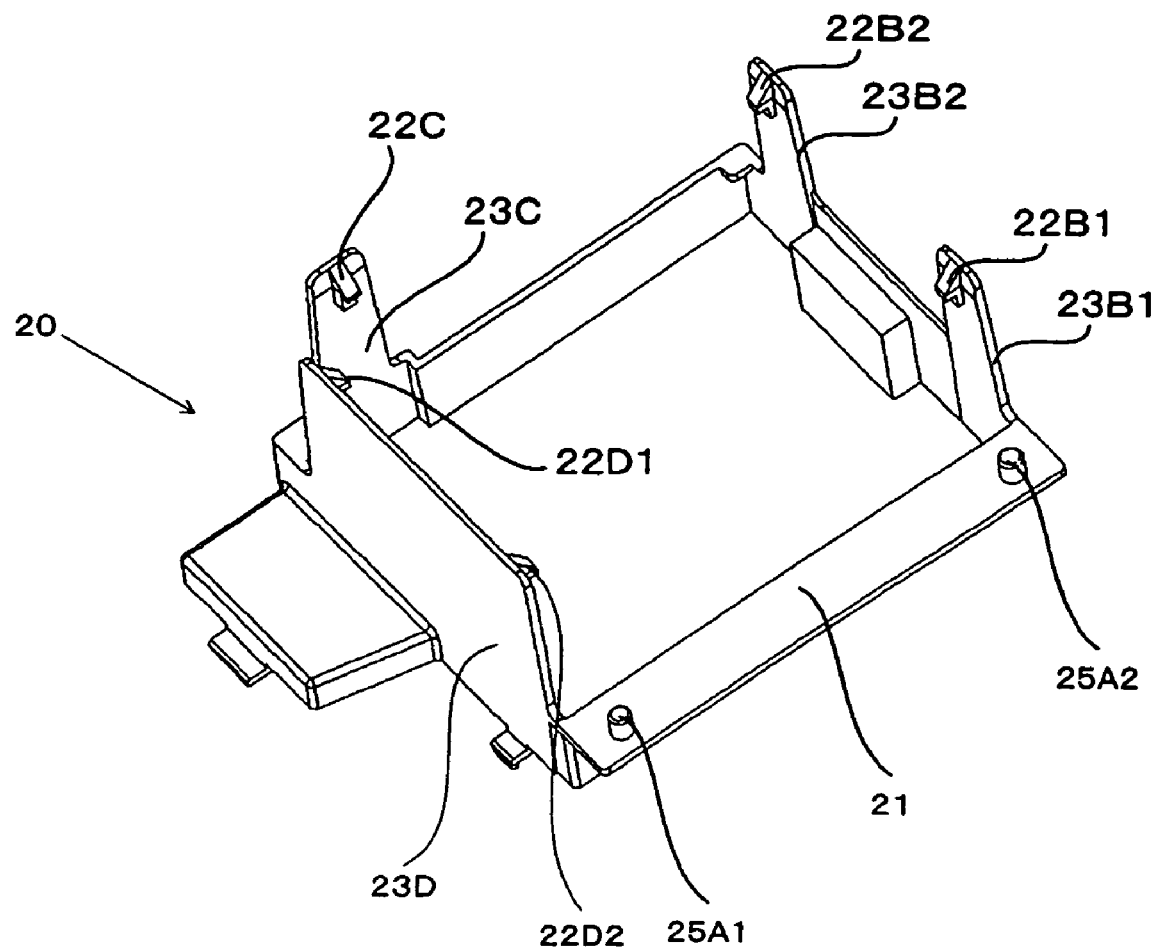

FIGS. 3(a) and 3(b) are a cross-sectional views before and after wiring respectively showing a side surface of the main body of Image forming apparatus X employing a fixing structure of wiring according to the present invention;

FIG. 4 is a perspective view showing a duct 20 and a fan case 10 in engagement after wiring;

FIG. 5 is a perspective view showing Duct 20 in Image forming apparatus X employing a fixing structure of wiring according to the present invention.

DETAILED DESCRIPTION OF THE PREFERRED EMBODIMENTS

With embodiments of the present invention described hereinafter with reference to the accompanying drawings, it is to be understood that the invention is not limited to those precise embodiments, and that various changes and modifications may be effected therein by one skilled in the art without departing from the scope or spirit of the invention as defined in the appended claims.

Figure 1:
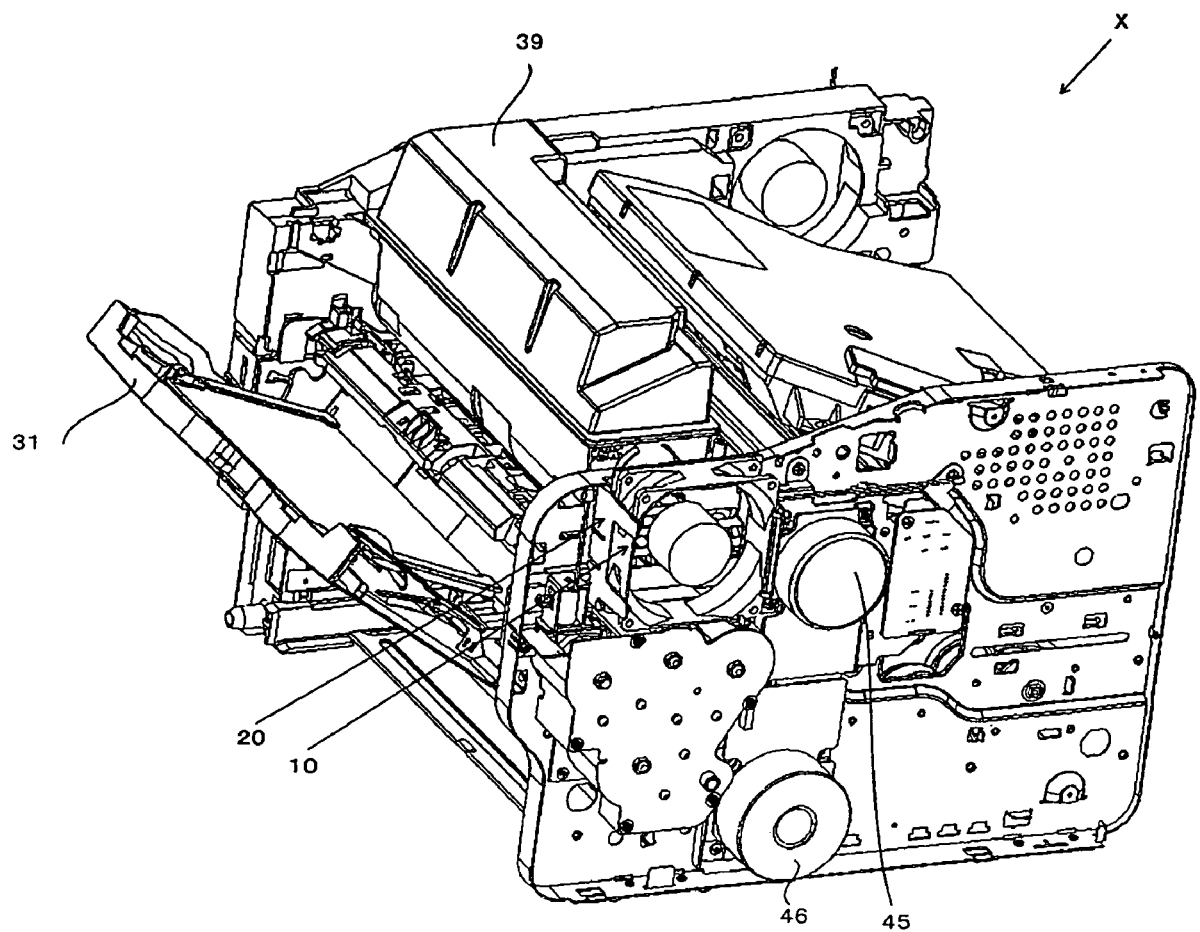
FIG. 1 is a perspective view showing an image forming apparatus X employing a fixing structure of wiring according to the present invention.
Figure 2:
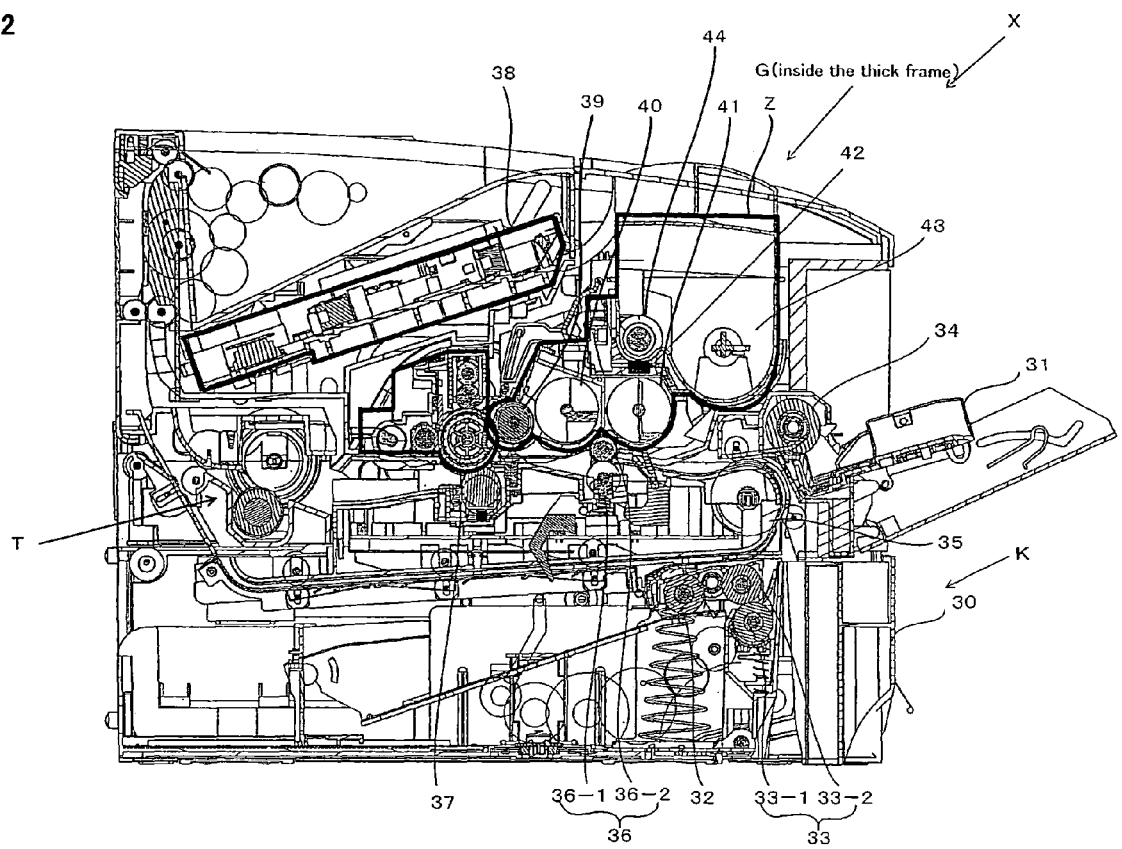
FIG. 2 is a cross-sectional view showing Image forming apparatus X employing a fixing structure of wiring according to the present invention.
Figure 3:
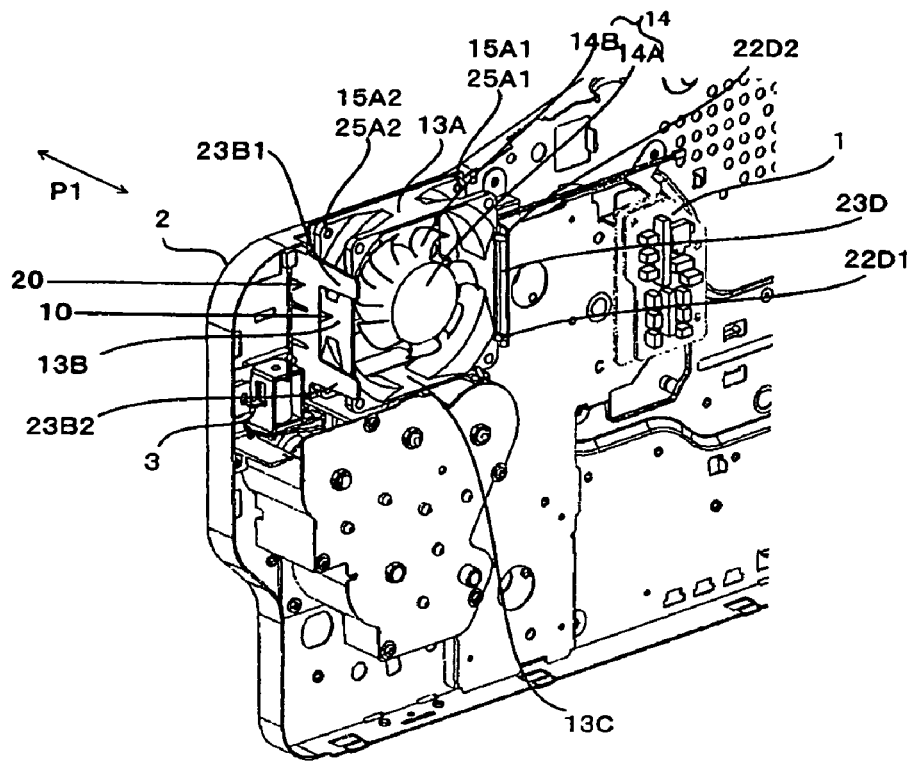
Figure 3:
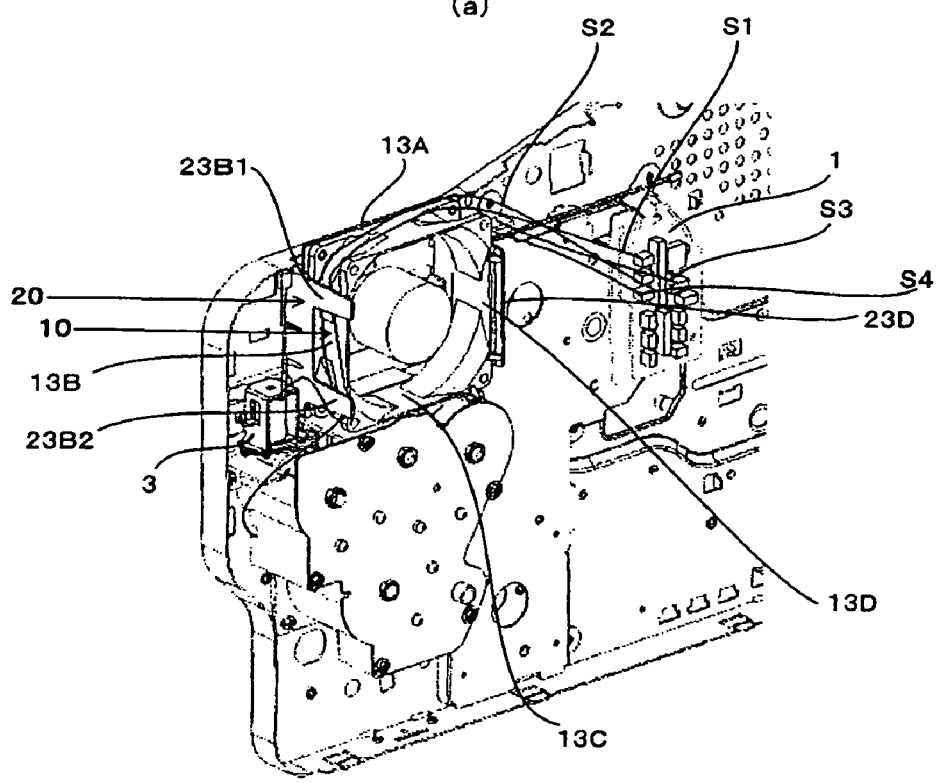

Referring now to FIGS. 1, 2, and 3, the schematic structure of an image forming apparatus X employing a fixing structure of wiring according to the present invention is briefly described in the following. In FIG. 1 and 3(b), a fan blade 14B is abbreviated for purpose of explanation.

As indicated in FIG. 2, Image forming apparatus X is roughly comprised of a paper feeder K, an image forming unit G, and a fixing member T.

Furthermore, as indicated in FIG. 3, provided in the side surface of the main body of Image forming apparatus X, near after-mentioned developing member Z provided in Image forming unit G, are a fan case 10 for housing a fan 14 for cooling the temperature near Developing member Z; a duct 20 for supporting Fan case 10 by engaging therewith; a control board 1 as a controller for executing the overall control of Paper feeder K and Image forming unit G; wires S (S1, S2, S3, and S4) for electrically connecting such as an after-mentioned solenoid 3, clutches C1, C3, and C4, and a motor; and a chassis 2 as a box-shaped structure in which above constituent elements are mounted. Fan case 10 and Duct 20 are described later in detail.

Wires S are comprised of a core material such as tin and soft copper, as well as a coating member as the member provided with elasticity of such as vinyl chloride and polyethylene that coats above core material. Wires S can be bended at will.

Additionally, on the top surface of the main body of Image forming apparatus X, an operation input unit not shown is provided. The operation input unit is an information input means operated by a user, and comprised of such as operation buttons and a liquid crystal touch panel.

As indicated in FIG. 2, Paper feeder K in the lower side of the main body of Image forming apparatus X is comprised of: a paper feeding cassette 30 for storing a plurality of recording paper of a predetermined size, a paper feeding roller 32 for paper-feeing the recording paper set in Paper feeding cassette 30, separation rollers 33 (separation rollers 33-1 and 33-2) for separating the recording paper fed by Paper feeding roller 32, a clutch C1 (not shown) of a motor for rotating Paper feeding roller 32 and Separation roller 33, a manual tray 31 on upper side of Paper feeding cassette 30 for paper-feeding the recording paper of indeterminate sizes, a manual paper feeding roller 34 for conducting paper-feeding of the recording paper set in Manual tray 31, a solenoid 3 (see FIG. 3) as a clutch of a motor (described later as a paper feeding motor 46) that rotates Manual paper feeding roller 34, an intermediate delivery roller 35 for delivering the recording paper delivered by Separation roller 33 and Manual paper feeding roller 34, a clutch C3 (not shown) of a motor (later-described as a paper feeding motor 46) for rotating Intermediate delivery roller 35, resist rollers 36 (resist rollers 36-1 and 36-2), a clutch C4 (not shown) of a motor (described later as a paper feeding motor 46) for rotating resist rollers 36, and a paper feeding motor 46 (see FIG. 1) for rotatably driving each of above rollers.

Resist roller 36 is a roller for delivering the recording paper so that the apical end of the toner image (the image formation starting part) formed on the surface of a later-described photoreceptor drum 37 and the apical end of the recording paper should be synchronized.

Image forming unit G is comprised of the followings: a photoreceptor drum 37 for supporting an electrostatic latent image; an electrifying member for uniformly electrifying the surface of Photoreceptor drum 37; a laser scanner unit 38 for forming an electrostatic latent image by irradiating the laser beam on Photoreceptor drum 37; a developing member Z for forming a toner image on the surface of Photoreceptor drum 37 by attaching the toner included in the developer to said electrostatic latent image; a cleaning member for cleaning Photoreceptor drum 37 after transfer; a destaticizing member for destaticizing the electric potential remained on Photoreceptor drum 37 after transfer; and a drum motor 45 (see FIG. 1) for rotatably driving a developing roller 39, a supplying roller 40, and a stirring roller 41 later described as being provided to Photoreceptor drum 37 and Developing member Z.

Developing member Z is comprised of the followings: a developing roller 39 for supporting the developer on the surface, a supplying roller 40 for stirring the developer then supplying it onto Developing roller 39, a stirring roller 41 for stirring the developer then supplying it onto Supplying roller 40, a developer refilling inlet 42 as an inlet for refilling the developer, a developer storing member 43 for storing the developer, and a delivery roller 44 for delivering the toner stored in Developer storing member 43 to Developer refilling inlet 42.

In the next, the image formation processing executed by Image forming apparatus X is briefly explained.

When the output operation of an image is conducted by a user from a data processing apparatus such as personal computers communicatably connected to Image forming apparatus X, the recording paper set in Paper feeding cassette 30 is fed by Paper feeding roller 32, then separated one-by-one by Separation roller 33. The recording paper separated by Separation roller 33 is delivered by Intermediate delivery roller 35 to Resist roller 36. The recording paper delivered by Intermediate delivery roller 35 is delivered further to the starting position of image formation by Resist roller 36.

On the other hand, when forming an image on an indeterminate recording paper, Manual tray 31 performs the paper-feeding. When a prescribed input operation is conducted by a user from the above-mentioned operation input unit, the recording paper set on Manual tray 31 is fed by Manual paper feeding roller 34, then delivered to Resist roller 36 by Intermediate delivery roller 35. The recording paper delivered by Intermediate delivery roller 35 is delivered further to the starting position of image formation by Resist roller 36.

When the output operation of an image is conducted by a user to the data processing apparatus, an image information signal (digital image data) is transferred to Image forming apparatus X from the data processing apparatus. The transferred image information signal is provided with a prescribed image processing in Image forming apparatus X, then inputted into Laser scanner unit 38. After that, the laser beam according to the image data after image processing is emitted from Laser scanner unit 38 to the surface of Photoreceptor drum 37.

The toner delivered by Delivery roller 44 from Developer storing member 43 through Developer refilling inlet 42 in Developing member Z is supplied to Supplying roller 40 by rotatably driving Stirring roller 41 by Drum motor 45. Supplying roller 40 supplies the toner to Developing roller 39 by rotatably driven by Drum motor 45.

Delivery roller 39 is then rotated by Drum motor 45, and thus, the thin layer of the toner formed on the surface of Developing roller 39 contacts the surface of Photoreceptor drum 37. Photoreceptor drum 37 then synchronizes with the rotation of Delivery roller 39 as being rotated by Drum motor 45. Thus, the electrified toner is attached to the electrostatic latent image on the surface of Photoreceptor drum 37, thereby forming a toner image. Photoreceptor drum 37 is continuously rotated by Drum motor 45, while the toner image is transferred by the transfer roller, that is pressingly contacted with Photoreceptor drum 37, to the recording paper delivered by Resist roller 36. The cleaning member is arranged in the lower downstream side of the rotating direction of Photoreceptor drum 37 than the above-mentioned transfer roller for the purpose of removing the remained toner and other excrescence on the surface of Photoreceptor drum 37. The destaticizing member is arranged in the lower downstream side of the rotating direction of Photoreceptor drum 37 than the above-mentioned cleaning member for the purpose of removing the electric potential remained on the Photoreceptor drum 37. The toner image transferred onto the recording paper is applied with heat by a fixing roller in Fixing member T, thus fixed onto the recording paper.

In the next, Fan case 10 and Duct 30 are explained in detail.

As shown in FIG. 4, Fan case 10 is comprised of: a square-shaped fan case base 11; a flange 12 having a round-shaped opening and being the same size of the square of Fan case base 11; a fan case side surfaces 13 (fan case side surfaces 13A, 13B, 13C, and 13D) that connect Fan case base 11 and Flange 12; and a fan 14 (a fan axis 14A and a fan blades 14B). Fan 14 is a blower for lowering the temperature near Developing member Z rose from the heat generated by such as stirring of the toner. Fan 14 is comprised of a combination of Fan axis 14A and Fan blades 14B, and Fan blades 14B of a nearly fan-shaped feather figure are provided around Fan axis 14A. Fan axis 14A is rotatably driven by a motor not shown. When Fan axis 14A is rotatably driven by a motor not shown, Fan blades 14B combined with Fan axis 14A are also rotatably driven, thereby blowing Developing member Z. Such Fan 14 is one example of a drive member driven with vibration.

In Fan case base 11, a locking holes 15 (a locking hole 15A1 and a locking hole 15A2) for engaging with Duct 20 is formed.

Fan case side surfaces 13, as shown in FIG. 4, are comprised of Fan case side surfaces 13A, 13B, 13C, and 13D (in FIG. 4, cannot see because of a duct side surface 23D described later)

Duct 20 is, as shown in FIG. 5, comprised of a duct base 21 for supporting Fan case 10 and Fan case base 11 and a duct side surfaces 23. Such Duct 20 is one example of a supporting member.

In FIG. 5, Duct side surfaces 23 is comprised of a duct side surface 23D which is the largest among Duct side surfaces 23, a duct side surface 23C next to Duct side surface 23D in clockwise direction, and duct side surfaces 23B2 and 23B1 which are parallel to Duct side surface 23D. When Fan case 10 and Duct 20 are engaged and then mounted to Chassis 2 as shown in FIG. 4, the even surface of Fan case side surface 13B and the even surfaces of Duct side surfaces 23B1 and 23B2 face each other. Furthermore, the even surface of Fan case side surface 13D and the even surface of Duct side surface 23D face each other.

In Duct base 21, locking projections 25 (locking projections 25A1 and 25A2) are formed for engaging with Locking holes 15 formed in Fan case base 11. With engagement between Locking hole 15A1 and Locking projection 25A1, and between Locking hole 15A2 and Locking projection 25A2, Fan case 10 is fixedly positioned in Duct 20.

In Duct side surface 23, a locking lugs 22 is formed for locking Fan case 10 with Duct 20 by being hooked on the upper edge of Fan case side surface 13. Duct side surface 23 is an elastic member capable of bending for locking Duct 20 with Fan case 10.

Locking lugs 22 is comprised of a locking lug 22B1 formed in Duct side surface 23B1, a locking lug 22B2 formed in Duct side surface 23B2, a locking lug 22C formed in Duct side surface 23C, and locking lugs 22D1 and 22D2 formed in Duct side surface 23D.

In the situation illustrated in FIG. 4, Locking lugs 22B1 and 22B2 are locked on the upper edge of Fan case side surface 13B, and Locking lug 22C is locked on the upper edge of Fan case side surface 13C, and Locking lugs 22D1 and 22D2 are locked on the upper edge of Fan case side surface 23D. Thus, Fan case 10 does not fall off Duct 20.

As shown in FIG. 3(a), Fan case 10 and Duct 20 are engaged together, and then mounted to Chassis 2.

When no cushion material is provided in between engaged Fan case 10 and Duct 20, if Fan 14 in Fan case 10 is driven and then Fan case vibrates, a wobble in vertical direction (in FIGS. 3 and 4, direction P1) or in right-angled direction with respect to Fan case base 11 may be generated because of the dimensional tolerance between Locking holes 15 and Locking projections 25. The wobble is absorbed by the wiring to be described later.

Additionally, Locking holes 15 and Locking projections 25 are respectively formed in Fan case 10 and Duct 20, however, locking projections and locking holes engaging with said locking projections can be respectively formed in Fan case 10 and Duct 20.

In the next, the wiring in Image forming apparatus X is explained.

FIG. 3(a) and FIG. 3(b) respectively show a cross-sectional view before and after the wiring.

As mentioned above, since Developing member Z heats up, Fan 14 as noted above is often placed near Developing member Z in the side surface of the main body of Image forming apparatus X. Moreover, since Paper feeding roller 32 and Separation roller 33, Manual paper feeding roller 34, Intermediate delivery roller 35, Resist roller 36 are arranged in the lower side of Developing member Z and Fan 14, Clutch C1 of a motor (Paper feeding motor 46) rotating Paper feeding roller 32 and Separation roller 33, Clutch C3 of a motor (Paper feeding motor 46) rotating Intermediate delivery roller 35, and Clutch C4 of a motor (Paper feeding motor 46) rotating Resist roller 36 are often installed. On the other hand, Control board 1, Clutches C1, C3 and C4, and Solenoid 3 are certainly connected by a wire S. With effective utilization of these, Wire S connecting from Control board 1 to Clutches C1, C3, C4, and Solenoid 3 is interposed in a gap formed between Fan case 10 housing Fan 14 therein and Duct 20 supporting Fan case 10 by engaging therewith, utilized as a cushion material.

In concrete terms, as shown in FIGS. 3(b) and 4, Wire S as one example of the wire wired inside of Image forming apparatus X runs outside of Fan case side surface 13A from Control board 1, and is fixed by being interposed in between the even surface of Fan case side surface 13B and the even surface of Duct side surface 23B1, and in the gap formed between the even surface of Fan case side surface 13B and the even surface of Duct side surface 23B2, and then connected to Clutch C1.

As in the case of the above-mentioned Wire S1, Wire S2 runs outside of Fan case side surface 13A from Control board 1, and is interposed in between the even surface of Fan case side surface 13B and the even surface of Duct side surface 23B1, and then in the gap formed between the even surface of Fan case side surface 13B and the even surface of Duct side surface 23B2. Wire S2 is then fixed by being interposed closer to the side of Fan case base 11 than Wire S1, thereby being connected to Solenoid 3.

Wires S3 and S4 run from Control board 1, and are fixed by being interposed in the gap formed between the even surface of Fan case side surface 13D and the even surface of Duct side surface 23D. Further, they are then fixed by being interposed in the gap formed between the even surface of Fan case side surface 13C and the even surface of Duct side surface 23C, thereby being connected to Clutches C3 and C4. Wire S4 is interposed closer to the side of Fan case base 11 than Wire S3.

As described above, Wires S is fixed by being interposed in the gap formed between the even surface of Fan case side surface 13 in Fan case 10 and the even surface of Duct side surface 23 in Duct 20.

In FIGS. 3(b) and 4, Wires S, S2, S3, and S are respectively indicated as a line for the purpose of explanation, however, two of these wires are wired as a couple in practice.

As described above, in the mounted condition as shown in FIG. 4, Duct side surface 23 contacts with Fan case side surface 13 in parallel as having their surface parts faced each other, and therefore, it is suitable for Wires S to be interposed in between Fan case side surface 13 and Duct side surface 23.

In other words, when Wires S is interposed in between the even surfaces (between Fan case side surface 13 and Duct side surface 23), the pressure to be applied to Wires S is dispersed compared to the case when wires are interposed between lines, points, or edges, and thus, the possibility of deformation and damage of the wires becomes low.

As described above, when Wires S is interposed in between even surfaces facing each other in the mounted condition of Fan case 10 and Duct 20, the even surface of Fan case side surface 13B and Wires S1 and S2, the even surface of Duct side surface 23B1 and Wires S1 and S2, the even surface of Fan case side surface 13D and Wires S3 and S4, and the even surface of Duct side surface 23D and Wires S3 and S4 contact respectively, and thus, Fan case 10 is elastically supported by elastic function of the coating material of Wires S. Such elastic function enables suppression of the vibration transmission of the fan housed in Fan case 10. And the wobble in between Fan case 10 and Duct 20 provided in Image forming apparatus X, in vertical or right-angled direction with respect to Fan case base 11, is dissolved with an infill of Wires S as the elastic body in the gap between Fan case 10 and Duct 20. This enables the reduction of unwanted sound generated by the wobble.

Furthermore, Wires S is fixed by being interposed in the gap formed between Fan case 10 and Duct 20, and therefore, additional and specific member for fixing Wires S is not need. Consequently, compared to the conventional fixing structure of wiring that requires additional and specific member for fixing Wires S, the structure described above is inexpensive.

In this embodiment, the fixing structure of wiring provided in an image forming apparatus is described as an example, however, this should not be intended to limit the scope, and the present invention can be applied to other electronic devices such as personal computers.

Additionally, in this embodiment, the fixing structure of wiring in which wires are interposed in between a fan case and a duct is described, however, this is merely an example, and the present invention can comprise any other fixing structures of wiring in electronic devices provided with a supporting member for supporting a drive member driven with vibration by engaging therewith, in which wires are interposed.

What is claimed is:

1. A fixing structure of wiring for fixing at least one wire wired in an electronic device which includes a fan, housed in a fan case, driven with vibration and a duct for supporting said fan by engaging said fan case, said fixing structure comprising:
   even surfaces being provided respectively on said fan case and said duct, said even surfaces facing one another in a mounted condition with a gap formed therebetween; and
   said at least one wire being interposed in said gap formed between said even surfaces of said fan case and said duct in such manner that at least an individual wire of said at least one wire is fixed by contact with at least respective regions of said even surfaces of both said fan case and said duct which are arranged directly opposed to one another at least one common length position of said at least the individual wire.

2. A fixing structure of wiring according to claim 1, wherein said fan is rotatably driven by a prescribed motor.

3. An image forming apparatus comprising a fixing structure of wiring according to claim 1.

4. An image forming apparatus comprising a fixing structure of wiring according to claim 2.

5. A fixing structure of wiring for fixing at least one wire wired in an electronic device which includes a fan, housed in a fan case, driven with vibration and a duct for supporting said fan by engaging said fan case, said fixing structure comprising:
   even surfaces being provided respectively on said fan case and said duct, said even surfaces facing one another in a mounted condition with a gap formed therebetween; and
   said at least one wire being interposed in said gap formed between said even surfaces of said fan case and said duct in such manner that at least an individual wire of said at least one wire is fixed by contact thereof with at least respective regions of both said even surfaces of said fan case and said duct facing one another.

6. A fixing structure of wiring according to claim 5, wherein said fan is rotatably driven by a prescribed motor.

7. An image forming apparatus comprising a fixing structure of wiring according to claim 5.

8. An image forming apparatus comprising a fixing structure of wiring according to claim 6.

9. A fixing structure of wiring for fixing at least one wire wired in an electronic device which includes a fan, housed in a fan case, driven with vibration and a duct for supporting said fan by engaging said fan case, said fixing structure comprising:
   even surfaces being provided respectively on said fan case and said duct, said even surfaces facing one another in a mounted condition with a gap formed therebetween; and
   said at least one wire being interposed in said gap formed between said even surfaces of said fan case and said duct in such manner that at least an individual wire of said at least one wire is fixed by contact with at least at least respective regions of both said fan case and said duct arranged directly opposed to one another and positioned to be coincident with a common length portion of said at least the individual wire.

10. A fixing structure of wiring according to claim 1, wherein said at least the individual wire comprises an electrically conductive core and an elastic coating.

11. A fixing structure of wiring according to claim 5, wherein said at least the individual wire comprises an electrically conductive core and an elastic coating.

12. A fixing structure of wiring according to claim 9, wherein said at least the individual wire comprises an electrically conductive core and an elastic coating.

13. A fixing structure according to claim 1, wherein said fan and said duct for supporting said fan are physically separate structures from one another that are independently mounted.

14. A fixing structure according to claim 13, wherein:
   one of the fan case or the duct has locking projections, and another one of the fan case or the duct has locking holes engaging with the locking projections, and by engaging the locking projections with the locking holes, the fan case is positioned to the duct;
   by dimensional tolerance of the locking projections and the locking holes, when the fan is driven, the fan case vibrates against the duct; and
   said at least the individual wire cushions said fan case against said duct when the fan is driven with vibration so as to effectively guard against wobbling of the fan.

* * * * *